United States Patent [19]

Sengupta

[11] Patent Number: 5,711,810
[45] Date of Patent: Jan. 27, 1998

[54] APPARATUS FOR VARIABLE OPTICAL FOCUSING FOR PROCESSING CHAMBERS

[75] Inventor: Somnath Sengupta, Warwick, Md.

[73] Assignee: The United States of America as represented by the Secretary of the Army, Washington, D.C.

[21] Appl. No.: 874,951

[22] Filed: Dec. 4, 1996

[51] Int. Cl.$^6$ ................................................. C23C 14/00
[52] U.S. Cl. ........................... 118/722; 118/715; 118/726
[58] Field of Search ................................... 118/715, 722, 118/726; 359/506, 503

[56] References Cited

U.S. PATENT DOCUMENTS

| | | | |
|---|---|---|---|
| 5,242,706 | 9/1993 | Cotell et al. | 427/2 |
| 5,290,761 | 3/1994 | Keating et al. | 505/1 |
| 5,386,798 | 2/1995 | Lowndes et al. | 117/50 |
| 5,432,151 | 7/1995 | Russo et al. | 505/1 |
| 5,490,912 | 2/1996 | Warner et al. | 204/298.02 |
| 5,499,599 | 3/1996 | Lowndes et al. | 117/50 |
| 5,535,128 | 7/1996 | Laube et al. | 364/150 |

*Primary Examiner*—Richard Bueker
*Attorney, Agent, or Firm*—Muzio B. Roberto; William E. Eshelman

[57] ABSTRACT

In a pulsed laser deposition system, the two optical actions of focusing and rastering, and the optical chamber window are combined into a single optics system. The single optics system is mounted on the processing chamber. Combining the three separate optical functions into one optics system facilitates laser beam control and reduces the space needed for the apparatus.

10 Claims, 3 Drawing Sheets

APPARATUS FOR VARIABLE OPTICAL FOCUSING FOR PROCESSING CHAMBERS

BACKGROUND OF THE INVENTION

The present invention relates in general to the way optical beams are focused into chambers for processing purposes, and in particular to the focusing of pulsed excimer laser beams into vacuum chambers for the purpose of deposition of thin films from solid targets. However, the invention may be applied when other energetic beams are used in different chambers for material processing operations.

The pulsed laser deposition (PLD) of thin films is a method in which a pulsed laser beam ablates a target medium to deposit a thin film on a substrate. It is a line-of sight deposition method.

FIG. 1 shows a conventional PLD setup. In it, a pulsed laser beam 12 (generally ultra-violet (UV) or visible wavelength) is introduced into the processing chamber 14 by focusing through a plano-convex lens 18. The laser port 20 of the vacuum (or pressure) processing chamber 14 consists of a window manufactured from material transparent to the ablation wavelength (e.g., quartz in the case of UV). Often, the lens 18 is provided with a linear motion capability to move the focal spot on the target. The reflective mirror 16 rasters the beam 12 on the target during the deposition to ensure uniform ablation of the target by the energetic pulses of the laser. The combination of the rastering of the mirror 16 and the linear motion of the lens 18 is to provide a random ablation pattern. The random ablation pattern promotes uniformity in the thickness during the deposition process.

The present invention combines the two optical actions of focusing and rastering, and the optical vacuum chamber window into a single optics system. Furthermore, the invention includes adapting that single optics system to the vacuum flange of the processing chamber.

One advantage of the present invention over the prior art is that it combines three separate optical functions into one optics system thereby facilitating beam control. Another advantage is that the space needed for the entire apparatus is reduced.

SUMMARY OF THE INVENTION

It is an object of the present invention to combine the two optical actions of focusing and rastering and the optical processing chamber window into a single optics system.

This and other objects of the invention are achieved by a port assembly for a processing chamber, comprising a bellows; a flange connected to one end of the bellows, for mounting the port assembly on the processing chamber; a second flange connected to another end of the bellows, the second flange including mutually orthogonal x, y, and z direction verniers; a third flange connected to the second flange; and a lens disposed in the third flange.

Preferably, the lens is a plano convex lens. However, lenses of other geometric shapes (e.g., cylindrical) may be used.

Another aspect of the invention is an apparatus comprising an energetic source (for example, a laser source); a processing chamber; and a port assembly mounted on the processing chamber; wherein energy from the energetic source (for example, a laser beam) enters the processing chamber through the port assembly.

Other objects, features and advantages of the invention will become apparent from the following detailed description taken in conjunction with the accompanying drawings.

DETAILED DESCRIPTION OF THE PREFERRED EMBODIMENTS

Figure 2:
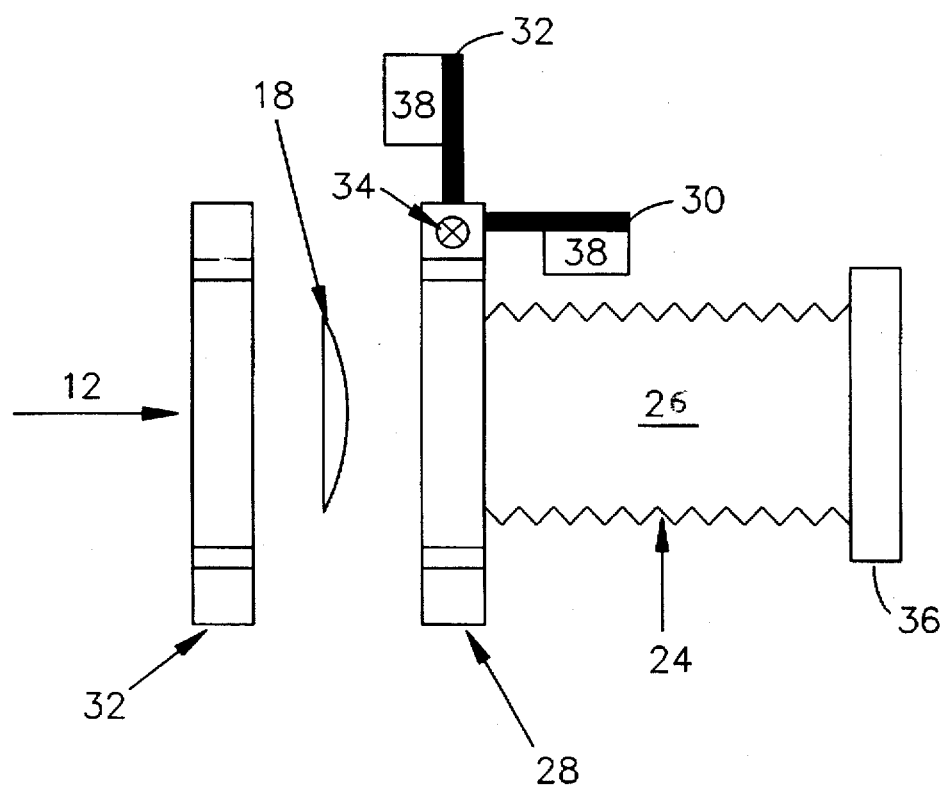
FIG. 2 is an exploded view of a processing chamber entry port assembly according to the invention.

FIG. 2 shows an exploded view of a processing chamber entry port assembly 22 according to the invention. The individual components for the port assembly 22 are commercially available.

The port assembly 22 includes a bellowed portion 24 comprising a bellows 26 mounted to flanges 28, 30. Flange 28 includes mutually orthorgonal x, y, and z direction adjustment verniers 30, 32 and 34, respectively. The x, y, and z verniers 30, 32 and 34 may be motorized with stepper motors 38. The laser port window is the plano convex lens 18. The lens 18 (which may also be other geometrical shapes, such as cylindrical) is housed in flange 32 which is connected to flange 28 by, for example, bolts. The flange 36 is mounted to the processing chamber 14 by, for example, bolting or welding.

Figure 1:
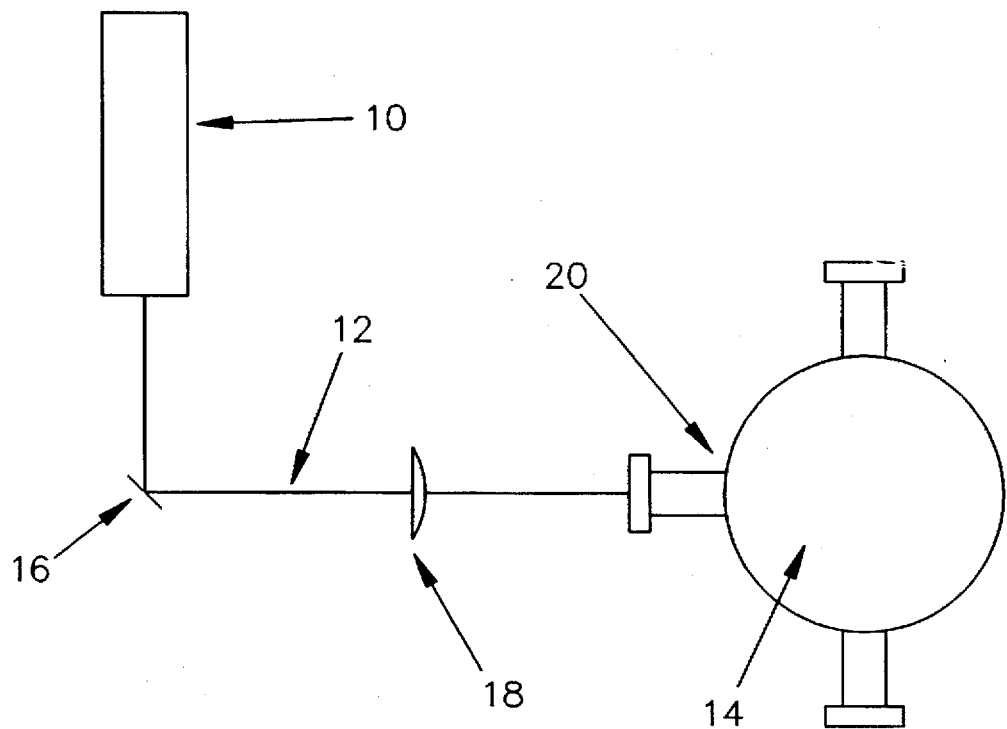
FIG. 1 shows a conventional PLD apparatus.

When the port assembly 22 is mounted to the chamber 14 and the linear motions are motorized, the incident spot of the laser beam 12 on the target may be systematically varied as in the apparatus of FIG. 1. The synchronized movement of the y and z verniers 32, 34 results in moving the beam spot on the target. Movement of the x vernier 30 provides the actual focusing of the beam 12 on to the target.

Figure 3:
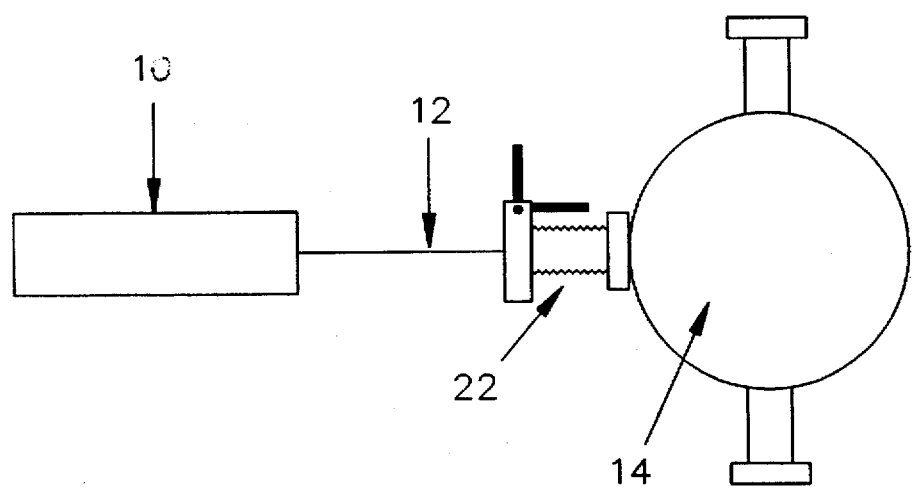
FIG. 3 shows a PLD apparatus according to the invention.

FIG. 3 shows the pulsed laser deposition apparatus with the port assembly 22 installed on the processing chamber 14.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. A port assembly for a processing chamber, comprising:
   a bellows;
   a flange connected to one end of the bellows, for mounting the port assembly on the processing chamber;
   a second flange connected to another end of the bellows, the second flange including mutually orthogonal x,y, and z direction verniers;
   a third flange connected to the second flange; and
   a lens disposed in the third flange.

2. The assembly of claim 1, wherein the lens is a plano convex lens.

3. An apparatus, comprising:
   an energetic source;
   a processing chamber; and
   the port assembly of claim 1 mounted on the processing chamber;
   wherein energy from the energetic source enters the processing chamber through the port assembly.

4. The apparatus of claim 3, wherein the lens is a plano convex lens.

5. The apparatus of claim 3, wherein the energetic source is a pulsed energetic source and the energy is pulsed.

6. The apparatus of claim 5, wherein the processing chamber is a vacuum chamber.

7. The apparatus of claim 5, wherein the processing chamber is a pressure chamber.

8. The port assembly of claim 1, further comprising stepper motors connected to the mutually orthogonal x,y, and z direction verniers for motorizing movement of the verniers.

9. The apparatus of claim 3, further comprising stepper motors connected to the mutually orthogonal x,y, and z direction verniers for motorizing movement of the verniers.

10. The apparatus of claim 3, wherein the energetic source is a laser source and the energy is a laser beam.

* * * * *